(12) United States Patent
John Swansen et al.

(10) Patent No.: US 7,174,276 B2
(45) Date of Patent: Feb. 6, 2007

(54) SYSTEM AND METHOD FOR TRACKING ENGINEERING CHANGES RELATING TO A CIRCUIT CARD

(75) Inventors: Sheldon Keith John Swansen, Ottawa (CA); Kenneth Glenn MacQueen, Merrickville (CA)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 11/215,945

(22) Filed: May 20, 2005

(65) Prior Publication Data

US 2005/0283342 A1 Dec. 22, 2005

Related U.S. Application Data

(63) Continuation of application No. 10/392,867, filed on Mar. 21, 2003, now abandoned.

(51) Int. Cl.
*G06F 13/18* (2006.01)

(52) U.S. Cl. .................... 702/187; 702/179; 702/183; 702/188

(58) Field of Classification Search ............... 700/285; 702/79, 130, 178, 182, 188, 198; 703/1; 705/28; 714/5
See application file for complete search history.

(56) References Cited

U.S. PATENT DOCUMENTS

| | | | |
|---|---|---|---|
| 5,307,261 A | | 4/1994 | Maki et al. ................ 705/29 |
| 6,295,513 B1 * | | 9/2001 | Thackston .................. 703/1 |
| 6,651,239 B1 * | | 11/2003 | Nikitin et al. .............. 716/18 |
| 6,892,159 B2 * | | 5/2005 | Weiss et al. ................ 702/130 |
| 6,952,808 B1 * | | 10/2005 | Jamieson et al. .......... 715/833 |
| 2003/0216881 A1 * | | 11/2003 | Weiss et al. ................ 702/130 |
| 2004/0078634 A1 * | | 4/2004 | Gilstrap et al. ............. 714/5 |

FOREIGN PATENT DOCUMENTS

EP    0 483 039 A    4/1992

OTHER PUBLICATIONS

Peng T-K. et al: "A step toward STEP-compatible engineering data management: the date models of product structure and engineering changes", Robotics and Computer Integrated Manufacturing, Elsevier Science Publishers Bv., Barking, GB., vol. 14, No. 2, Apr. 1998, pp. 89-109.

(Continued)

*Primary Examiner*—Marc S. Hoff
*Assistant Examiner*—Felix Suarez
(74) *Attorney, Agent, or Firm*—Jim Zegeer

(57) ABSTRACT

The invention provides a system and a method of electronically tracking a history of engineering change orders (ECOs) associated with a manufactured device. The device has at least one electronic component thereon. The method comprises, generally, storing in an electronic storage device associated with the device, the history of ECOs and updating the history of ECOs when a new ECO is associated with the device to indicate whether the new ECO was implemented on the device. The system utilizes the method and has an electronic storage device associated with the device and a data element stored therein. The contents thereof indicate the history of ECOs for the device and allow modification thereto to indicate whether a new ECO was implemented thereon. An ECO history enables a determination to be made of compatibilities between hardware and software elements and between hardware and firmware elements.

5 Claims, 4 Drawing Sheets

OTHER PUBLICATIONS

Hunter, C. S. et al: "CSTAR database for advanced test systems", Electronic Components And Technology Conference, 1993, Proceedings., 43rd Orlando, FL, USA Jun. 1-4, 1993, New York, NY, USA, IEEE, Jun. 1, 1993, pp. 166-168.

J. Lettieri et al., "Electronic Engineering Change Level Control, Oct. 1980", IBM Technical Disclosure Bulletin, vol. 23, No. 5, Oct. 1, 1980, p. 2008.

* cited by examiner

Data structure 200

ECO string

| Header 202 | Data Field 204 | | | | | |
|---|---|---|---|---|---|---|
| # Of Bytes | "1" 206A | "0" 206B | "0" 206C | Pad | Pad | Pad |

Rows 208

| "1" Row 208A; Col.210A | | | | | |
|---|---|---|---|---|---|
| "1" Row 208B; Col.210A | "0" Row 208B; Col.210B | | | | |
| "1" Row 208C; Col.210A | "0" Row 208C; Col.210B | "0" Row 208C; Col.210C | "10" Row 208C; Col.210C | "0" Row 208C; Col.210C | "1" Row 208C; Col.210D |
| "1" Row 208D | "0" Row 208C; Col.210B | | | | |
| "End of Row" Row 208E | | | | | |
| Row 208 | | | | | |

FIG. 2

|  | Module | HFCL | HSCL | BHSCL | Firmware ID | Firmware ID | Firmware ID | Software ID | Software ID | Software ID |
|---|---|---|---|---|---|---|---|---|---|---|
| Row 302A | CPU 130A Rel 1 | XX1X (306A) | 1X0X | 1X01 | FirmElem1 Rel 1 | FirmElem2 Rel 1 | FirmElem3 Rel 1 | SoftElem1 Rel 1 | SoftElem2 Rel 1 | SoftElem3 Rel 1 |
| Row 302B | CPU 130A Rel 2 | X01X | X101 | X10X | FirmElem1 Rel 1 | FirmElem2 Rel 2 (304(2)B) | FirmElem3 Rel 1 |  |  |  |
| Row 302C | CPU 130A Rel 2 |  | X10X (310C) |  |  |  |  | SoftElem1 Rel 2 (308(1)C) | SoftElem2 Rel 1 | SoftElem3 Rel 1 |
| Row 302D | CPU 130B Rel 1 | X011 | X101 | XX01 | FirmElem1 Rel 1 | FirmElem2 Rel 3 | FirmElem3 Rel 1 | SoftElem1 Rel 2 | SoftElem2 Rel 2 | SoftElem3 Rel 1 |
| Row 302E | Board Rel 1 | X011 | X101 | X1X1 | FirmElem1 Rel 1 | FirmElem2 Rel 4 | FirmElem3 Rel 1 | SoftElem1 Rel 2 | SoftElem2 Rel 2 | SoftElem3 Rel 2 |
|  |  | Column 306 | Column 310 | Column 312 | Column 304(1) | Column 304(2) | Column 304(3) | Column 308(1) | Column 308(2) | Column 308(3) |

Matrix 300

10   Card 100 Rel 1 – Label 300A

FIG. 3

SYSTEM AND METHOD FOR TRACKING ENGINEERING CHANGES RELATING TO A CIRCUIT CARD

REFERENCE TO RELATED APPLICATION

The present application is a continuation of application Ser. No. 10/392,867 filed Mar. 21, 2003, now abandoned.

FIELD OF THE INVENTION

The invention relates to a system and method for tracking of engineering change orders (ECOs) relating to repairable elements of an electronic device, in particular a system and method for tracking ECOs of field replaceable units (FRUs), such as circuit cards, of a communication device connected to a communication network.

BACKGROUND OF INVENTION

It is common for an electronic device (which includes most types of communication devices) to utilize a series of circuit cards to provide aspects of the functionality of the device. Generally, a feature of a circuit card is that it can be removed and replaced from the electronic device when the circuit card fails or needs to be upgraded. In many devices, the circuit card may be replaced in the field, in situ. Accordingly, the circuit card is often referred to as a field replaceable unit (FRU).

Circuit cards typically have hardware, software and firmware elements used in hardware circuits to provide their functionality. The hardware elements may comprise upgradeable components such as CPUs, memory modules and other upgradeable and replaceable devices. Firmware is typically stored in non-volatile electronic devices, such as EEPROMs, EPROMs, PLDs and PGAs, and volatile devices such as FPGAs and RAM, provide low level, executable code performing various calculations and operations on input and output signals depending on the program embodied in the firmware. Software, which is frequently stored non-volatile memory, but executes from volatile memory such as RAM, provides an operating code for a program which is executed on a CPU. Upgrades may be implemented to an element to correct existing operational errors or to improve its performance. For example, in hardware a "cut and strap" may be added to change an electrical connection on one of its circuits. In software, a new routine may be added providing a new feature for the program.

During the life of an electronic device, engineering change orders (ECOs) may be implemented in a circuit card to correct operational defects or implement manufacturing cost reductions. An operational defect may be a design defect in hardware circuit or software element implemented on the circuit board. A manufacturing cost reduction may be utilizing a different set of (less expensive) components to perform the identical functionality of an earlier design of a hardware circuit for the circuit card.

For repair purposes, it is useful to track the progression of ECOs during the life of a circuit card. This is frequently done by associating an ECO with each circuit card of the electronic device. Typically, each circuit card has a unique ECO number relating to the ECO. A component of each ECO number, such as a version number, is incremented as each engineering change is made to the circuit board. Typically, this may be done by keeping a hardcopy or a softcopy register of all implemented ECOs for a card at a repair station. Accordingly, when a circuit board is being repaired, the repair personnel may examine the log, get the ECO information and determine what repairs have been implemented on the card. Appropriate updates may be made to the circuit card, depending on the number of the ECO version of the card and the current number of the ECO version for cards being built. As the register is often associated with the station in a database maintained on a server or a computer, the tracking information associated with the card remains with the station, which causes potential loss of information if the register at the station is lost. However, when a circuit board is repaired, it will be appreciated that an ECO which was implemented to effect a manufacturing cost reduction does not necessarily have to be implemented on the circuit board. There is typically little cost benefit in retrofitting a board with a manufacturing cost reduction design.

It will be appreciated that the use of a simple ECO number with a version component to track both operational defects and manufacturing cost reduction implementations does not provide full information to the repair personnel. Further, with the known methods of tracking ECOs, it is difficult to determine whether an upgrade intended for a software/firmware/hardware element on the circuit card is compatible with the ECOs that have been implemented on the card. Accordingly, there is a need for an improved system and method for tracking types of ECOs related to a circuit board to provide improved tracking of compatibilities amongst the circuit boards.

SUMMARY OF INVENTION

In a first aspect, a method of electronically tracking a history of engineering change orders (ECOs) associated with a manufactured device is provided. The manufactured device has at least one electronic component installed thereon. The method comprises storing in an electronic storage device associated with the manufactured device the history of ECOs and updating the history of ECOs when a new ECO is implemented on the manufactured device to indicate that the new ECO was implemented thereon.

The method may have the history of ECOs indicating, for a given ECO whose history is contained therein, whether that given ECO is a mandatory change or an optional change.

The method may have the history of ECOs stored as a series of bits in the electronic storage device.

The method may have the electronic storage device mounted on the manufactured device.

The method may have the history of ECOs accessible by an analysis device connectable to the manufactured device when the manufactured device is being examined.

The method may have the manufacturing device utilizing a programmable element which is installed on the manufactured device. Further, the method may compare the history of ECOs of the manufactured device against a version of the programmable element to determine a compatibility level between the version of the programmable element and the manufactured device. Further still, the history of ECOs of the manufactured device may be used to identify compatible versions of the programmable element which may be installed on the manufactured device.

The method may access an ECO mask for the version of the programmable element. Therein, the ECO mask identifies only the ECOs in the ECO history which affect the compatibility level of the version of the programmable element.

The method may have the compatibility level indicating at least one of the following conditions: (i) whether the version of the manufactured device is compatible with the programmable element; (ii) whether the version of the manufactured device is backwards compatible with the programmable element; and (iii) whether the version of the manufactured device is not compatible with the programmable element.

The method may have the programmable element being a software element. Further, the manufacturing device may utilizes a firmware element which is installed on the manufactured device. Also, the history of ECOs of the manufactured device is further compared against a version of the firmware element to determine whether the version of the firmware element is compatible with the manufactured device.

The method may have versions of the software element and versions of the firmware element provided in a bundle of installable elements, which is accessible by the manufactured device.

In a second aspect, a system for electronically tracking a history of engineering change orders (ECOs) associated with a manufactured device is provided. The manufactured device has at least one electronic component. The system comprises an electronic storage device associated with the manufactured device and ECO information. The ECO information indicates the history of ECOs associated with the manufactured device. The ECO information can be modified and expanded to indicate the addition of a new ECO and whether the new ECO was implemented on the manufactured device.

The system may have comparison information relating ECOs to versions of a programmable element which are installable on the manufactured device, indicating the compatibility of the versions with the ECOs and the manufactured device and ECO mask information to identify the ECOs which affect the operation of the versions of the programmable element for the manufactured device. Further, the system may have an analysis device connectable to the electronic storage device. The analysis device utilizes the ECO information with the comparison information and the ECO mask information to determine whether a version of the programmable element may operate on the manufactured device.

The system may have second comparison information relating ECOs to versions of a firmware element which are installable on the manufactured device, indicating the compatibility of the versions of the firmware element with the ECOs and the manufactured device and second ECO mask information to identify the ECOs which affect the operation of the versions of the firmware element for the manufactured device. Further, the analysis device utilizes ECO information, the second comparison information and the second ECO mask information to determine whether a version of the firmware element may operate on the manufactured device.

The system may further have a bundle of versions of the programmable element and versions of the firmware element, the bundle being accessible by the manufactured device. Also, the programmable element may be a software element; the analysis device may utilize the ECO information, the comparison information, the second comparison information, the ECO mask information and the second ECO mask information to select a compatible version of the software element and the firmware element from the bundle to be installed into the manufacturing device.

In other aspects of the invention, various combinations and subset of the above aspects are provided.

BRIEF DESCRIPTION OF THE DRAWINGS

The foregoing and other aspects of the invention will become more apparent from the following description of specific embodiments thereof and the accompanying drawings which illustrate, by way of example only, the principles of the invention. In the drawings, where like elements feature like reference numerals (and wherein individual elements bear unique alphabetical suffixes):

FIG. 2 is a table providing two versions of engineering change order (ECO) information associated with the circuit card used by the embodiment of FIG. 1;

FIG. 3 is a block diagram of a matrix correlating ECOs against versions of hardware, software and firmware elements for the card of FIG. 1, according to an embodiment.

DETAILED DESCRIPTION OF THE EMBODIMENTS

Figure 1:
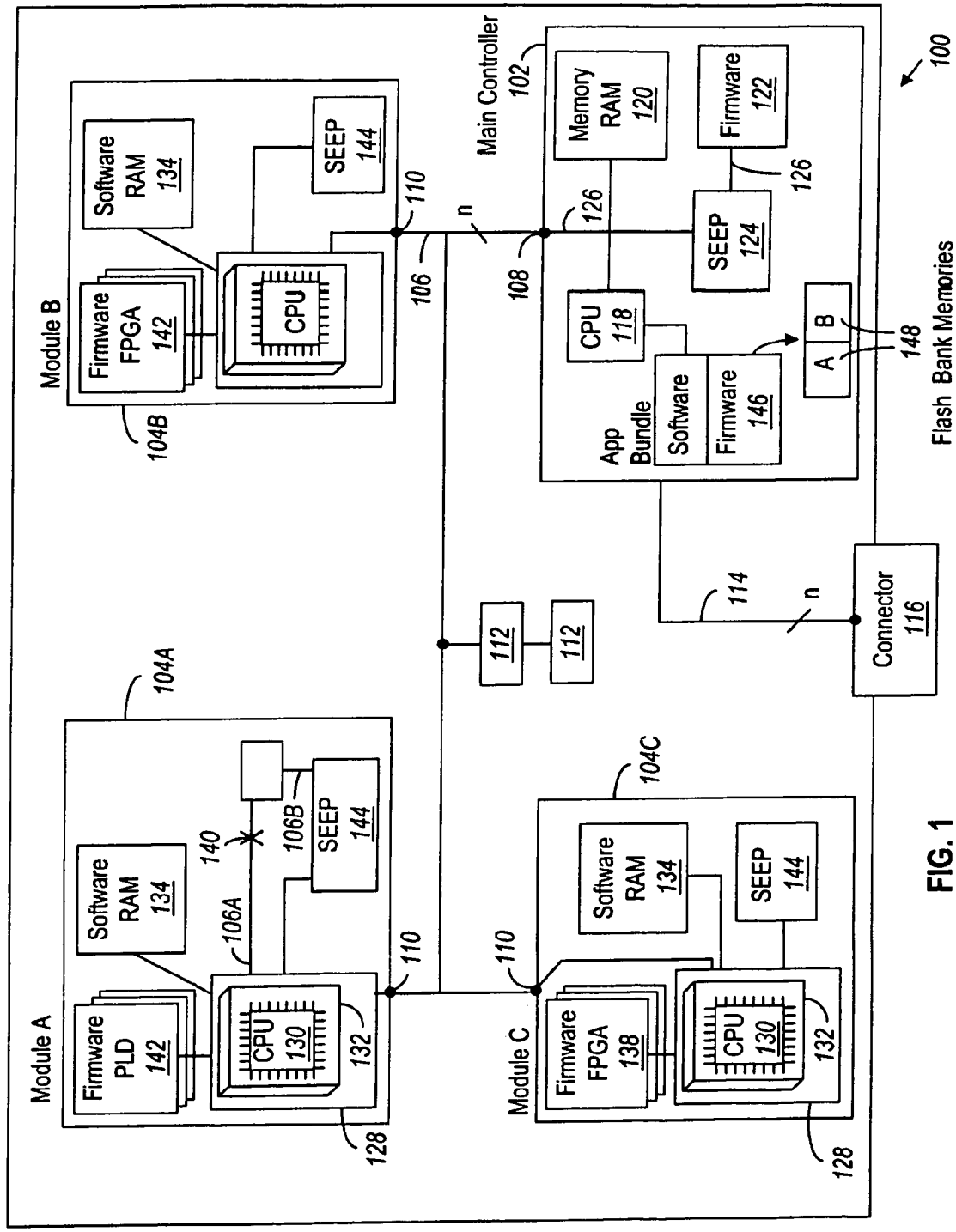
FIG. 1 is a block diagram of hardware elements of a circuit card used in association an embodiment of the invention.

The description which follows, and the embodiments described therein, are provided by way of illustration of an example, or examples, of particular embodiments of the principles of the present invention. These examples are provided for the purposes of explanation, and not limitation, of those principles and of the invention. In the description which follows, like parts are marked throughout the specification and the drawings with the same respective reference numerals.

Basic Features of Electronic System associated with an Embodiment

The following is a description of an electronic system associated with an embodiment.

Referring to FIG. 1, electronic circuit card 100 is shown, which is a generic manufactured device. Circuit card 100 is a component of an electronic device. Physically, circuit card 100 may be an FR-4 board with various electronic modules mounted thereon and electrically connected via circuit tracks to provide manipulation and production of various electronic signals. Exemplary modules on circuit card 100 include main controller 102 and modules 104a, 104b and 104c. Controller 102 communicates with modules 104 through circuit tracks 106 in card 100. The interface point between controller 102 and tracks 106 is shown as node 108. Similarly, the interface between connections 106 and each of modules 104 is shown as nodes 110. Other devices 112 may also be connected either directly or indirectly to tracks 106 thereby allowing them to communicate with either controller 102 or modules 104. As shown, an additional set of circuit tracks 114 is provided from main controller 102 to an external connector 116, thereby allowing circuit card 100 to be associated with other external devices (not shown), which may form part of the electronic device. Each of tracks 106 and 114 may comprise n separate electrical tracks for carrying signals between controller 102 and modules 104.

Controller 102 provides the main controlling system for modules 104. On controller card 102 there is CPU 118, RAM 120, firmware devices 122 and non-volatile memory 124. It will be appreciated that there may be several of any of the elements on main controller 102. For the shown implementation, RAM 120 stores an operating program which is executed on CPU 118. Firmware devices 122 are programmable, each having separate program codes. Non-volatile memory 124 stores the compressed operating program for controller 102 and stores configuration information about controller card 102. Non-volatile memory device 124 can be implemented as a Serial Electrically Erasable PROM (SEEP) and is used to store local engineering change order (ECO) information, per an embodiment, relating to circuit card 100. In the embodiment, SEEP 124 is used to store data which acts as a historical label for the ECOs of circuit card 100. Further detail on the contents of SEEP 124 is provided below. Internal connections 126 provide an electrical connection between the elements of controller 102 and interface node 108.

Generally, each of modules 104 comprises the following hardware, software and firmware elements. Hardware element 128, abstractly, is an upgradeable component, and is shown as local CPU 130. In an embodiment, CPU 130 is mounted directly to module 104 in order to dissuade switch operators from making their own modifications to module 104. However in another embodiment, CPU 130 is mounted in a socket 132 which provides a releasable interface for the electrical contact points of CPU 130 to other components in modules 104. Socket 132 may comprise a zero-insertion force ("ZIF") socket, known in the art. Accordingly, with socket 132, CPU 130 may be removed and replaced with an upgraded component. Also, an upgrade on hardware element 128 may be a physical modification, such as a "cut and strap" made to electronic tracks on the module, shown as modification 140, which breaks track 106A, indicated by the "x" therethrough, and adds track 106B to components in module A. The software element 134 is an executable program code stored in a non-volatile program storage element, such as flash memory, and is decompressed and run from a volatile memory device, such as RAM, and is controlled by an aspect of the hardware element 128. For the example, the software element is stored in local RAM 136 and operates on CPU 130. Software, as is known, frequently undergoes revisions and has to be installed into a released circuit card 100. The firmware elements 138 are executable program codes and are provided in a number of program storage elements, including programmable volatile and non-volatile devices such as PLDs, FPGAs and other devices 142. Each of the firmware elements 138 may utilize different program codes. As with software elements, firmware elements 138 often are upgraded, which occasionally have to be installed into an existing circuit card 100. An electronic signature containing information on the hardware elements 128 on module 104 may also be stored in SEEP 144. It will be appreciated that other modules 104 may not have all of the hardware, software and firmware elements. Generically, the software and firmware elements may be referred to as programmable elements.

As noted earlier, during the life of card 100, numerous engineering change orders (ECOs) may be implemented to correct and/or update hardware, software and firmware elements on card 100. An ECO may be made to cards 100 as they are manufactured, to cards 100 already manufactured and installed or, possibly, to cards 100 which are being repaired. There are several types of ECOs. For example, for cards 100 which have not yet been shipped (including cards 100 being manufactured and cards 100 manufactured and about to be shipped), there may be the following types of ECOs, per Table A:

TABLE A

ECOs for Manufactured Cards

| ECO Manufacturing Category | Implementation Action |
| --- | --- |
| Phase-In | ECO is implemented on a going-forward basis for new cards. |
| WIP (Work in Progress) | ECO is implemented for all cards which are currently being built. |
| WIP/Fin | "Fin" represents "finished" goods, including cards built and in the field. ECO is implemented for all cards which are being built, cards which have been built and are finalized but not stored for shipping and cards which are finalized which are stored for shipping. |
| Recall | ECO must be implemented on all cards being manufactured and cards which have been manufactured. |

However, for cards which are already in the field, there may be a different implementation action for an ECO, including, for example, exemplary ECOs per Table B:

TABLE B

ECOs for Cards in the Field

| ECO Field/Repair Category | Field Action |
| --- | --- |
| No Action | None |
| Optional | Optional (only if requested) |
| Mandatory | Mandatory, but only for cards provided to the repair station. |

It will be appreciated that WIP or WIP/Fin ECOs may or may not require that the affected cards be recalled for repairs, depending on the field action. Further, actions for cards in Table A may be completely independent from actions for cards in Table B. Further actions in either Table A or Table B may include additional actions, depending on manufacturing and repair requirements for production/repair of a card.

Current practices preferably implement all ECO actions for a card when the card is manufactured, but cards which are already in the field may not necessarily be recalled to have a new ECO implemented thereon. For example, a phase-in ECO change is not needed to be performed on a repaired circuit card, per Table B, but would be performed on a newly manufactured card which was manufactured after the phase-in date.

As such, during the production and implementation lifespan of a family of cards 100, different cards 100 within the family which are manufactured at different times will likely have a different set of ECOs implemented thereon, compared with other cards 100 in the family. The embodiment provides ECO information which may be used to track the ECOs which have been implemented in a given card 100, which is lacking in the prior art.

Further Detail of an Embodiment

Referring to FIG. 2, an embodiment provides a system and method for tracking ECO information on card 100, thereby providing improved tracking of ECOs. Therein, data structure 200 contains ECO information associated with a family of cards 100 and ECO implementation information for a given card 100 belonging to the family. The ECO information represents a history of ECOs associated with a given card 100. The contents of each data structure 200 is populated with relevant ECO information and is stored locally on a given card 100.

Data structure 200 comprises a header field 202 and a data field 204. The data field 204 comprises an expanding sequential string of data cells 206 used to track ECO information. In this ECO string, each cell 206 represents a particular ECO and the value of the cell represents indicates whether the ECO was implemented or not for that given card 100. For each new ECO, the ECO string is lengthened by one cell at the end and that last cell is populated with a value representing the implementation status of that ECO for that given card 100. The length of the number of data cells 206 contained within the ECO string is tracked in header field 202. In the embodiment, the data cells 206 are each preferably one bit in length and the header field 202 preferably contains a size value indicating a number of byte segments which are currently occupied by the data field 204. Accordingly, the ECO string grows in length by byte length segments. As each additional byte length segment is added, there will be a number of pad bits 208 which follow the last tracked ECO to fill the remainder of the last byte of the ECO string. Initially, each data cell 206 in the ECO string is preferably set to be a pad bit.

In the embodiment, the marking convention for data cells 206 utilizes a "1" to indicate that the ECO associated with that data cell 206 has been implemented for that card; and a "0" to indicate either (i) that the ECO has not been implemented; or (ii) that it is a pad bit at the end of the ECO string. In other embodiments, other markings may be used to identify that the ECO was implemented and to identify pad bits. For example, in other embodiments, the last data cell 206 in ECO string may be indicated by having a detectable "end of string" value stored in the next data cell 206.

An exemplary progression of an ECO string, embodied in data field 204, is provided. Initially, it is presumed that the length of data field 204 is one byte. Accordingly, data field 204 is padded with eight bits of "0". Next, during the manufacturing of cards 100, it is presumed that three ECO are sequentially implemented. The first ECO is "WIP/Fin". For all cards 100 built immediately after the first ECO, in their data field 204, data cell 206A is present and is marked with a "1", indicating that the first ECO was a WIP/Fin. For the remaining spaces in data field 204, there are seven pad bits. Second, a "phase-in" ECO is implemented. Accordingly, for all cards 100 built at immediately after the second ECO, a second, in addition to the prior information, sequential data cell 206B is used in data field 204 and its value is marked with a "1", to indicate that it was implemented. For the remaining spaces in data field 204, there are now six pad bits. Finally, a third ECO is implemented, which is a "Phase-in/No Action". For cards built after the third ECO, it is presumed that the phase-in no action is implemented. However, any cards that were built prior to the phase-in date will not have this ECO applied. Since the field action is "no action", all cards returning through the repair and upgrade process will not have this ECO applied. Accordingly, for cards built earlier than the phase-in date and repaired after the third ECO, in addition to the prior information, a third data cell 206C is provided in data field 204 and its value unchanged from the original pad bit. However, when comparing the value of the third data cell 206C against a list of ECOs implemented for the family of cards 100, the presence of the "0" in third data cell 206C indicates that the third ECO was not implemented. For the remaining spaces in data field 204, there are five pad bits.

By examining the data fields 204 of different cards 100, it can be determined which ECOs were specifically implemented thereon. Cards 100 built between the first and second ECOs will have a data field 204 of "10000000"; cards 100 built between the second ECO and the third ECO will have a data field 204 of "11000000"; cards 100 built after the third ECO will have a data field 204 of "11100000". Finally, cards built between the second and the third ECO, and which are repaired after the third ECO will have a data field 204 of "11000000". Note that such repaired cards have an identical data field 204 to unrepaired cards built between the second and the third ECO, even though cards repaired after the third ECO have a third ECO associated with them (although not implemented). For the embodiment, this situation is acceptable because the more critical information for the embodiment is to track which ECOs have been implemented on a given card 100. In other embodiments, there may be a need to distinguish cards 100 having an ECO which is associated with a given card 100 (but has not been implemented) from cards 100 which were built before that ECO associated with cards. This may be done by changing the value of the pad bit or by defining a "not implemented" value for an ECO which would be used, when appropriate, in data field 204.

For the embodiment, ECO information, embodied in exemplary data structure 200 is preferably stored at a centrally accessible location, such as in SEEP 124 on main controller 102. The data format of the ECO information may comprise any computer readable format, including an ASCII file, a spreadsheet file, bit-wise data or a coded binary file.

It will be appreciated that in order to track ECO information for any card 100, separate global ECO information, representing all ECOs for the family of cards 100 must be maintained and trackable against the ECO information in a given card 100 of that family. This global ECO information may be stored electronically and compared electronically against the ECO information extracted from a given card 100.

It will be appreciated that for a card 100 which is being repaired, the ECO information stored thereon is preferably extractable by a repair station having an interface to the card 100. Such an interface may connect to connector 116 (FIG. 1). The repair station has operative hardware and software to extract the ECO information from its stored location (here SEEP 124) and analyze its contents against the global ECO information. Further, after any ECO is implemented on the card 100 being repaired, the repair station can produce an updated ECO string which incorporates the status of the implemented ECO and then can update the stored ECO information on the card being repaired. The repair station may read and update the values of the ECO information for the card 100 being repaired using techniques known in the art.

In another embodiment, ECO information may be stored as a series of expanding rows 208 of information. For a given row, each column entry 210 therein represents a particular ECO. The value of the entry in a column 210 represents whether that ECO was implemented. When a new ECO is added, a new row 208 is added. In the new row, a new column 210 at the end of the row is also added to track the status of the new ECO. For example, in a card 100 which has had no ECOs, rows 208 are fully empty. On the implementation of a first ECO, ECO row 208A is added to rows 208. If the first ECO was implemented on a card 100, cell 210A is marked with a '1'. Accordingly, upon reading rows 208, it can be determined that the card 100 was built when only the first ECO was implemented, by examining that there is only row 208A in rows 208. After a second ECO is implemented, for cards 100 built thereafter, rows 208 has row 208B added. If the second ECO was implemented, entry 210A is marked as being implemented, to track the first ECO, and 210B is marked as being implemented, to track the second ECO. When card 100 is repaired, its rows 208 can be extracted and analyzed. Later, after third and fourth ECOs are implemented, rows 208 may be updated for cards 100 built at that time by adding third row 208C and fourth row 208D to the ECO history in a similar manner to the addition of the second row. An end of row mark 208E may be added to indicate the end of the ECO information.

In yet another embodiment, ECO information may be encoded as part of a serial number associated with card 100. For example, if serial number "1234" is associated with card 100 as a base serial number, then additional codes in a code regime may be appended to the base serial number to indicate detail of ECOs which are associated with that card 100. For example, one code regime may use two additional ECO indicators which are attached to the end of the serial number. The first ECO indicator would signify the last guaranteed ECO which was implemented on that card 100. The second ECO indicator would signify the most recent ECO implemented associated with that series of cards. Using this regime, if ECO "A" was the last guaranteed ECO implemented on that card 100 and ECO "D" was the most recent ECO which could have been implemented on that card 100, then the serial number would be encoded as "1234AD". By examining the ECO indicators, an operator may determine what ECO was implemented on the card 100 (here, ECO "A") and approximately when was the card built (here, sometime after ECO "D" was introduced). It will be appreciated that this information may be translated into some appropriate digital format and stored in some non-volatile memory device associated with card 100, such as flash memory 124. For example, this information may be encoded, stored and analyzed in a hexadecimal format. For example a bit-string "11010110" would relate to ECOs being implemented in positions, "1", "2", "4", "6" and "7" in the ECO string, which would be encoded and stored as hexadecimal D6.

Use of ECO Information

Referring to FIG. 1, using ECO information stored in SEEP 124, an embodiment provides tracking of ECOs against compatible software elements 134 and firmware elements 138. In view of ongoing ECOs related to card 100, after an ECO is implemented on card 100, changes incorporated may affect the compatibility of the card 100 with various versions of software elements 134 and firmware elements 138 available to the card 100. For example, if an ECO deletes a storage element 142 into which a particular firmware element 138 is programmed, then, that firmware element 138, in any version, cannot be associated with card 100 having that ECO implemented thereon. Alternatively, when upgrades are made to software elements 134 and firmware elements 138, the upgrades may necessarily require that a certain ECO be implemented on a given card 100. For example, in card 100, software elements 134 and firmware elements 138 may be continually individually upgraded during the operational life of card 100. As such, if a software upgrade increases the program size of the software to be larger than the original storage device of card 100 and an ECO implements a sufficiently large storage device for the software upgrade, then that card 100 must have that ECO implemented thereon if the larger software element 134 is to be installed on card 100.

As such, ECO information string in SEEP 124 may be extracted and analyzed against requirements for versions of software elements 134 and firmware elements 138 for a particular hardware element 128 on card 100 by an appropriate analysis device which can read the ECO information through a communication interface and conduct an analysis of the ECO information against available versions of the software and firmware elements.

Referring to FIG. 2, using the format of the above-described ECO information for data field 204, the following example illustrates use of ECO information in an ECO string against operational requirements of versions of software element 134. It will be appreciated that a similar comparison may be made for versions of a firmware element 138. For the example, it will be presumed that for data field 204, the ECO string is represented by the bit string "10110" (pad bits are ignored), stored in data structure 200 for a given card 100. The contents of ECO string indicates that five ECOs have been associated with the card 100 and that, from left to right, the first, third and fourth ECOs (the first being the oldest ECO), have been implemented in that given card 100. In other embodiments, the order may progress from right to left. Further, for a given software element 134, it is presumed that there are four versions thereof, "A" through "D", and that each version needs to have certain ECOs implemented to operate.

In order to facilitate a comparison of the ECO string with the proposed software element 134 version, for each software version, the embodiment utilizes an ECO mask to mask out all non-essential ECO elements (for that version) in the ECO string, thereby identifying only the ECOs which affect the ability of the software version to be used on that given card 100. The ECO mask may be implemented as a mask bitstring. As such, when the ECO mask is applied against the ECO string, the unmasked bits are readily identified and evaluated against the requirements of the given software version. This information may be conveniently stored in a table. Table C provides exemplary comparison information listing each software version against its ECO requirements and its related ECO mask bitstring.

TABLE C

| Software element 134 Version | Required ECOs | Mask String |
| --- | --- | --- |
| A | First | "_XXXX" |
| B | Second | "X_XXX" |
| C | Fourth | "XXX_X" |
| D | Fourth and Fifth | "XXX__" |

In the mask bitstring, an "X" indicates a "don't care" value for that particular ECO for that version of the software element and a "_" indicates that the value of that ECO needs to be evaluated. The value would be either "1" or "0" to signify whether or not the ECO must or must not be applied. For the embodiment, it is preferable that the evaluated ECO must be implemented, necessitating that the field be a "1". (In other embodiments, it may be that the evaluated ECO must not be implemented, necessitating that the field be a "0". Known bitstring manipulation and comparison techniques may be used to address either situation.) Accordingly, for the given card 100, comparing each version of software element 134 against its ECO string "10110" indicates that Versions "A" and "C" may operate thereon, while Versions "B" and "D" will not operate thereon. In an embodiment, comparison information contained in Table C may be stored in an accessible location in card 100, such as flash memory 148. Further, the mask string for versions of software elements 134 may be stored in a different section of flash memory 148. Alternatively, mask bitstrings may be stored remotely to card 100 and accessed when a given card 100 is being analyzed for its software and firmware compatibilities.

Also, data extracted from comparison information (such as that provided in Table C) and the ECO information provides present and backward compatibility information of any version of a software element 134 with each of the ECOs for a given card 100. This data may be processed by a procedure operating with that given card 100. In particular, the mask bitstring may be used to evaluate these compatibilities. As a particular example, for version "A" of software element 134, as long as a card 100 has at least the first ECO implemented thereon, then version "A" may operate on that card. Version "A" will still operate on that card whether or not any other ECOs have been implemented, as their values are "don't cares".

For a given card 100, when a new ECO is implemented, that card may be evaluated against each existing version of the software element 134 to assess its compatibility therewith. Then, the information in Table C may be updated, including the mask bitstring. Similarly, when a new version of software element 134 is developed, it may be assessed against the existing ECOs and then the information in Table C may be updated.

The embodiment also enables use of the ECO information for a given card 100 to compare the ECO information for that card against ECO requirements of different versions of software elements 134, firmware elements 138 and hardware elements 128.

The embodiment also enables the ECO information for a given card 100 to be correlated against software/firmware download bundles available to that card. In particular, the ECO information for that card may be used to identify particular sets of compatible software and firmware elements for it stored in the bundles.

Referring to FIG. 1, to illustrate the correlation, a description is provided of a bundling system related to a card 100 for tracking software elements 134 with compatible firmware elements 138 for that card. Therein, the bundling system bundles a particular version of a software element 134 with its compatible versions of firmware elements 138. The bundling system is referred to herein as an application bundle 146. In application bundle 146, for each version of a software element 134, there is a firmware loader, which provides an interface between the application bundle 146 and the hardware element 128. The firmware loader is a software program which loads the selected firmware elements 138 into their respective memory devices 142. Accordingly, when the particular software element 134 is provided to main module 104, the embodiment may select the most appropriate set of firmware elements 138 for that particular software element 134. In the embodiment, each software element 134 has a record, which is accessible by other elements (such as a firmware loader, described later) of firmware elements 138 and hardware elements 128 which will operate with it. Using bundles of versions of software elements 134 with bundles of versions of firmware elements 138, it is possible to separately update one version of a software element 134 and one version of a firmware element 138 for a given card 100. It will be appreciated that as a bundle, the firmware elements 138 and software elements 134 may be upgraded independently of each other.

For a given card 100, using the ECO string, the application bundles 146 and data extracted from comparison information (such as information found in Table C), the embodiment can determine which software element 134 is compatible with that card, using a similar process described above.

Further, for any particular version of a software element 134, the ECO string can be used to determine which versions of firmware elements 138 (normally associated with a version of a software element) are compatible with a given card 100. In order to track compatibilities of the various firmware elements 138, comparison table includes comparison information relating to the various firmware elements 138 associated with a particular version of a software element 134. Table C.1 is an exemplary representation of the comparison information which is associated with Version "A" of a particular software element 134 (as described above).

TABLE C.1

| Version of Firmware Element 138 | Required ECOs | Mask String |
|---|---|---|
| M | First only | "_XXXX" |
| N | First and Third | "_X_XX" |
| O | First and Fourth | "_XX_X" |
| P | First, Fourth and Fifth | "_XX__" |

As Version "A" of software element 134 required the first ECO to be implemented, then versions "M", "N", "0" and "P" firmware element 138 (which is compatible with Version "A" of software element 134), must also have the first ECO implemented. This relationship is noted by having the first ECO noted as being required for each version of the firmware element 136. Other specific required ECOs for a particular version of a firmware element are identified in Table C.1. All of these requirements are reflected in the mask bitstrings. It will be appreciated that the data in Tables C and C.1 may be combined in other arrangements, including having a single mask bitstring for a particular version of a software element 134 and a particular version of a firmware element 138. Further, other linking and compatibility information between various versions of software elements 134 and firmware elements 138 may be provided in another section of Table C.1 (not shown).

Referring to FIG. 3, another embodiment collects and stores information similar to information provided in Tables C and C.1 in a central location, to provide a system and method for tracking compatible software elements 134 and firmware elements 138 with members of the family of cards 100. Therein, matrix 300 is used to track compatibilities of ECOs of the family of cards 100 against existing firmware elements 138 and software elements 134. Field 300A provides a marker for the version of the matrix stored for a given set of hardware elements 128. For the example, the version of matrix 300 is "Card 100 Rel 1". Matrix 300 is preferably stored at a centrally accessible location, such as in flash memory 148 on main controller 102. The data format of matrix 300 may comprise any machine readable format, including an ASCII file, a spreadsheet file or a coded binary file. Accordingly, main controller 102 has access to data indicating the hardware/firmware/software element compatibilities for itself and its associated modules 104.

In matrix 300, a row entry is provided for a particular hardware element 128 in card 100. Fields in the row provide information about its current set of compatible firmware elements 138 and software elements 134. In describing the rows and columns of matrix 300, first a description is provided of the relationship between a hardware element 128 and its affected firmware elements 138. Next, a description is provided of the relationship between a hardware element 128 and its affected software elements 134.

In matrix 300, for a hardware element 128 listed in a row, entries in rows 302 identify hardware elements 128 for the module 104 which affect firmware elements 138 and software elements 134. As an example, entries 302A, 302B and 302C relate to a first CPU, such as CPU 130A, on card 100 "CPU A", versions "Rel 1" and "Rel 2"; entry 302D related to a second CPU, such as CPU 130B, "CPU B", having "Rel 1"; entry 302E relates to the card 100 itself, as "cut and strap" revisions may be made to the card itself such as modification 140.

For the hardware/firmware element relationships, for each hardware element 128 identified in row 302, a list of firmware elements 138 whose ability to function are affected by the upgrade to that hardware element 128 is provided in entries in the corresponding set of columns 304. Each entry in set of columns 304 is a reference number and version number for a particular firmware download for the affected firmware element 138 identifying a compatible version of that firmware element which will operate with the particular version of the hardware element in that row. Accordingly for the example in set of columns 304, three firmware downloads are identified relating to the first CPU. They are identified as "FirmElem1 Rel1" in column 304A(1), "FirmElem2 Rel1" in column 304A(2) and "FirmElem3 Rel1" in column 304A(3); each firmware download is the latest version of each firmware element which is compatible with that upgraded version of that hardware element 128 in entry 302A.

Entries in matrix 300 indicate the compatibility levels for the ECOs with a hardware element 128 and its associated firmware elements 138, using the mask string data described earlier. A mask string 306 is provided for each upgraded hardware element 128 in matrix 300, in a similar fashion to the mask bitstring information provided in Tables C and C.1.

When an ECO is made, its effect(s) on the listed software elements 134 and firmware elements 138 in matrix 300 must be recognized by some manner and then matrix 300 must be updated accordingly. For the present embodiment, newly implemented ECOs and their effect(s) on software elements 134 and firmware elements 138 are tracked by design personnel responsible for designing and maintaining the family of cards 100. The personnel would also be responsible for making the appropriate updates to matrix 300 and Tables C and C.1. However, once updates are made, the embodiment provides an automated system to identify appropriate software elements 134 and firmware elements 138 for a given card 100 having a given ECO history stored in its SEEP 124.

It will be appreciated that other information relating versions of software elements 134, firmware elements 138 and hardware elements 128 against the ECO history may be stored in other matrices in similar or other formats.

For tracking compatibilities between ECOs and hardware/software element relationships, for each hardware element 128 identified in row 302, a list of software elements 134 whose ability to function are affected by the upgrade to that hardware element 128 is provided in entries in the corresponding set of columns 308. The software elements may be large sections of code, e.g. entire software elements which operate on a microprocessor, or small sections of code, e.g. software elements embodying device drivers. The number and size of software elements tracked against a hardware element may be set to the particular requirements of a tracking system utilizing matrix 300. Each entry in set of columns 308 is a reference number and version number for a particular software download for the affected software element 134. Accordingly for the example in set of columns 308, three software downloads are identified relating to the first CPU. They are identified as "SoftElem1 Rel1" in column 308A(1), "SoftElem2 Rel2" in column 308A(2) and "SoftElem3 Rel1" in column 308A(3); each software download is the latest version of each software element 134 which is compatible with that upgrade version of that hardware element 128 in entry 302A. For example, if hardware element 128 is a new CPU requiring a new software element 134 for "SoftElem1", new row 302C is added. Entry 300C provides the details of the new hardware element 128, namely "CPU 130A Rel3". HSCL field 310C contains an ECO mask indicating any ECOs which must be present or not present in the card 100 in order to enable that hardware element 128 with that associated set of software elements 134 to operate, having similar properties as ECO strings described earlier for Tables C and C.1. For matrix 300 as an example, ECO mask for CPU 130A, Rel 1 and its associated software elements is set to "1X0X".

It will be appreciated that the compatibility of software elements 134 to a version of a hardware element 128 is generally independent of the compatibility of that version of the hardware element 128 to its affected firmware elements 138. Accordingly, the values in HFCL field 306 and HSCL field 310 do not necessarily correlate to each other for a given version of a hardware element 128.

In addition to mapping current compatibilities with a hardware element 128 and a software element, a Backward Hardware/Software Compatibility Level (BHSCL) entry in field 312 provides compatibility information of ECOs between versions of hardware elements and their associated sets of software elements. For example, if a hardware element is a microprocessor and the microprocessor is upgraded to provide new functionality, a new set of software elements may be associated with the upgraded microprocessor to support the new functionality. The upgraded microprocessor and the new set of software elements would appear in matrix 300 as a new row entry. However, older software elements associated with older microprocessors may still be able to operate on the upgraded microprocessor, as long as the new functionality is not required in the system. In such a case, the BHSCL provides an indication of which ECOs are needed to operate an older set of software elements for that version of the hardware element.

To set the BHSCL ECO string, as with the ECO strings in Tables C and C.1, design personnel must determine which versions of software can operate with the version of the hardware element identified in a particular row 302. Generally, design personnel may generate a BHSCL ECO string by taking the related HSCL ECO string in column 310 and then determine which particular ECOs in that string may be masked such that the resulting ECO string allows an older version of a software element to operate on that version of the hardware element.

In a similar manner to the BHSCL ECO string, in another embodiment matrix 300 may include backwards compatibility information of a firmware element to a version of a hardware element (not shown), i.e. a backward hardware firmware compatibility level (BHFCL) ECO string. It will be readily seen that a similar analysis of compatibilities between versions of software elements to a given hardware element would be performed for versions of firmware elements to a given hardware element to generate BHFCL ECO strings.

The embodiment also tracks changes made to firmware elements 138 and software elements 134 which do not affect the functionality of the existing levels of hardware elements 128. For example, a change may be made to a software element 134 to correct an internal error which affects nothing else. To track these changes, a new version of the software element 134 is used. In the new matrix version, a new version value in field 300A is entered and each entry for amended software element 134 (or firmware element 138) is updated to its new version. For example, if a software element 138 "SoftElem3" in column 308(3) is upgraded to "SoftElem3 Rev2" and the upgrade did not affect any other elements, then new software element SoftElem3 Rev2 would now appear in column 308(3) of the new matrix. Also, new matrix 300' is created with identical entries to matrix 300, except that each entry for "SoftElem3" in column 308(3) is changed to SoftElem3 Rev 2. A similar revision to matrix 300 and its elements would be made for internal revisions made to firmware elements 138. It will be appreciated that historical data in older matrices 300 may be stored in archives.

As an additional feature, once a compatible version of a software element 134 and a compatible list of versions of firmware elements 138 is determined for a card 100 (using, for example, ECO information and Tables C and C.1 or matrix 300) the proper software element 134 and firmware elements 138 may be identified in application bundle 148 and downloaded to the correct storage devices in that card 100 using the firmware loader and additional interface software. If the proper software elements 134 and firmware elements 138 are not available, an error message is preferably generated.

Expanding on the present and backward compatibility evaluation of the embodiment described above, data extracted from sources such as matrix 300, Tables C and C.1 and the ECO information, may also be used to identify compatible versions of firmware elements 138 for a card 100. In certain circumstances, it may be preferable to upgrade a firmware element 138, independent of its associated software element 134, or vice versa. This may occur if card 100 has a standardized set of software elements 134 installed thereon, which is not meant to be updated for the time being. Again, this data may be processed by a programmed procedure operating with that card 100 to identify specific isolated versions of a firmware element 138 or versions of a software element 134 for that card 100.

An application bundle may be stored in a flash bank of memory 148. In the embodiment, there is an active flash bank 148 and an inactive flash bank 148. The operating firmware and software elements are stored in the active flash bank 148 and new downloads are stored in the inactive flash bank 148. Once the new download is verified, the embodiment can switch between the active and inactive flash banks 148.

Figure 4:
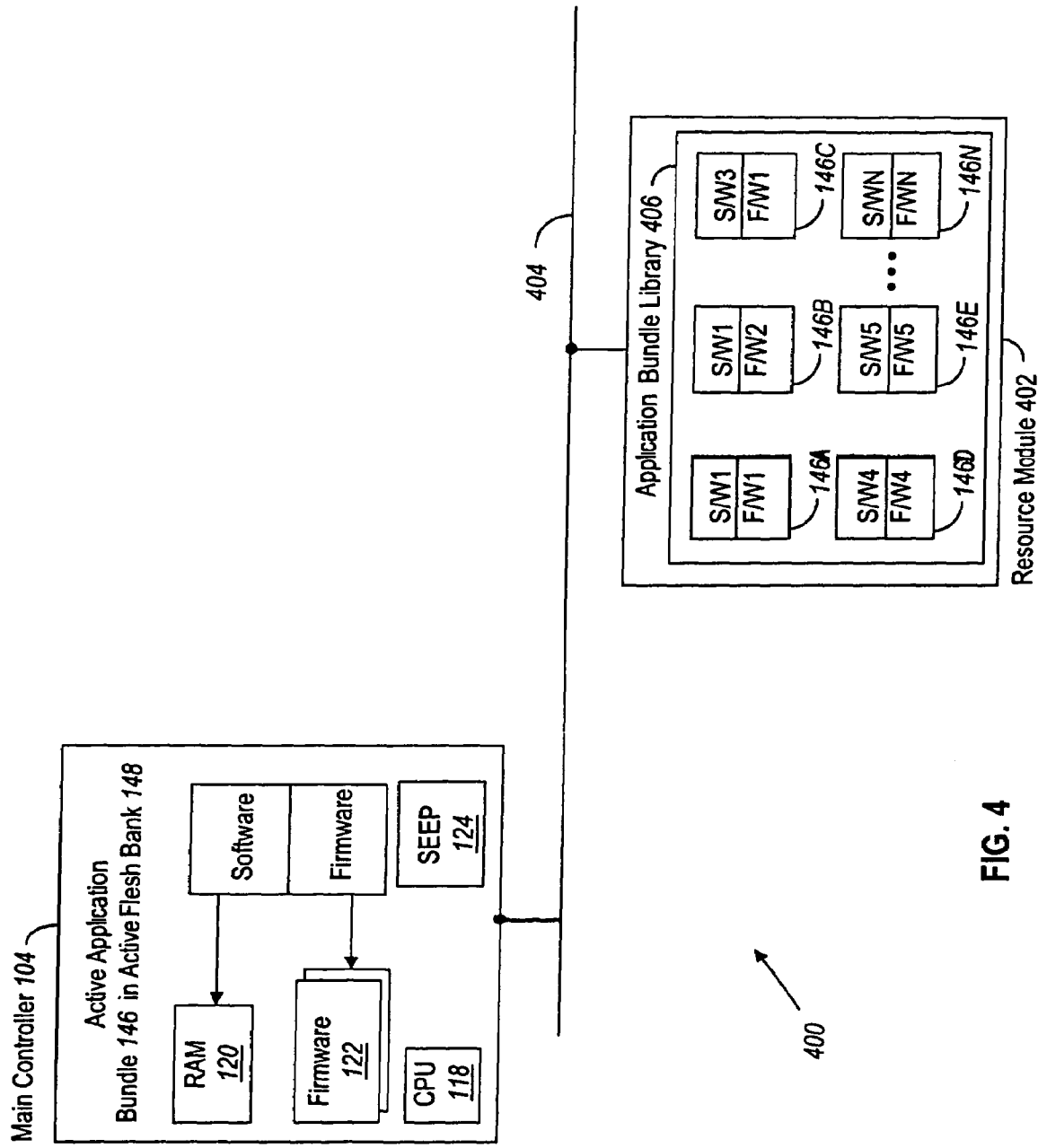
FIG. 4 is a block diagram of a resource module associated with the main controller card used with the embodiment shown in FIG. 1.

Referring to FIGS. 1 and 4, following is an example of an illustrative download system 400 for an embodiment, which may be used in conjunction with the ECO information to determine which application bundle 146 should be provided to card 100.

Therein, resource module 402 is connected via a communication link 404 to main controller 104. Resource module 402 comprises an application bundle library 406, which contain a series of application bundles 146A . . . 146N for many hardware elements 128, as described earlier. Each application bundle 146 has one software element 134 associated with a set of firmware elements 138. The same software element 134 may be associated with several different sets of firmware elements 138 in different bundles. The operator of main controller 104 selects the resource module 302 from which the firmware elements 138 and/or software elements 134 are to be downloaded. However, using embodiments described above, a particular bundle 146 may be selected from the series of bundles after appropriate comparisons are made against the ECO information for the target card 100. Resource module 402 may be a CD-ROM, and FTP site, a web server or other known data sources. Next, after a comparison is made with the ECO information and the bundles 146, the operator can select the appropriate application bundle 146 from the resource module 402. The selected application bundle may be selected because either: (i) it has software elements 134 (and/or firmware elements 138) which are presently compatible with the target card 100; or (ii) it has software elements 134 (and/or firmware elements 138) which are backward compatible with the target card 100. Next, one of the flash banks 148 in module 104 which is to receive the application bundle 146 is selected. Generally, the flash bank 148 which is selected is the non-operational flash bank, i.e. the current firmware and software elements are provided from the current flash bank 148. The new application bundle is downloaded to the inactive flash bank.

From the above description, it will be appreciated that the embodiment provides a centralized system for tracking ECOs for a card and for tracking compatibilities for firmware and software elements for that card.

Other embodiments may have network repair stations which can access all of the ECO information of multiple installed cards remotely through an appropriate communication network and compare the compatibilities of several cards against compatibility information to determine which software and firmware elements can be used with each installed card. In such a system a repair station and its associated analysis device can access ECOs of installed cards in electronic devices through a communication network. For a given software upgrade, the repair station can determine whether or not the software upgrade can be applied to all or any of the installed cards. Using the accessed ECO information, the operator at the repair station can be informed of any target cards which require ECOs to be applied before the software upgrade can be applied to those cards.

It is noted that those skilled in the art will appreciate that various modifications of detail may be made to the present embodiment, all of which would come within the scope of the invention.

We claim:

1. A system for electronically tracking a history of engineering change orders (ECOs) associated with a manufactured device having at least one electronic component thereon, comprising:
   an electronic storage device associated with the manufactured device;
   ECO information associated with the electronic storage device, indicating the history of ECOs associated with the manufactured device and allowing modification thereto to indicate when a new ECO was implemented on the manufactured device;
   comparison information relating ECOs to versions of a programmable element installable on the manufactured device, indicating the compatibility of the versions with the ECOs and the manufactured device;
   ECO mask information to identify the ECOs which affect the operation of the versions of the programmable element for the manufactured device; and an analysis device having access to the ECO information, the comparison information and the ECO mask information and adapted to determine whether a version of the programmable element may operate on the manufactured device, and second comparison information relating ECOs to versions of a firmware element which are installable on the manufactured device, indicating the compatibility of the versions of the firmware element with the ECOs and the manufactured device;

second ECO mask information to identify the ECOs which affect the operation of the versions of the firmware element for the manufactured device; and the analysis device further utilizes the second comparison information and the second ECO mask information to determine whether a version of the firmware element may operate on the manufactured device.

2. The system for electronically tracking a history of ECOs associated with a manufactured device, as claimed in claim 1, further comprising a bundle of versions of the programmable element and versions of the firmware element, the bundle being accessible by the manufactured device, wherein the programmable element is a software element and the analysis device utilizes the comparison information, the second comparison information, the ECO mask information, the second ECO mask information and the ECO information to select a compatible version of the software element and the firmware element in the bundle to install into the manufacturing device.

3. A method of recording engineering change orders (ECOs) issued for a field replaceable unit (FRU) defined by a type and a current design version, comprising:
(a) building an ECO history for the FRU by storing all ECOs implemented to the FRU during any manufacturing and repair processes on a non-volatile storage on-board the FRU;
(b) receiving a new ECO specifying a change to the FRU;
(c) whenever the FRU includes a programmable element for implementing an application of a certain version, comparing the ECO history against the application version;
(d) effecting the change specified by a new ECO for the FRU;
(e) updating the ECO history with the new ECO, and maintaining a centralized database with a list of all ECO's issued for all versions of the FRU.

4. A method of recording engineering change orders (ECOs) issued for a field replaceable unit (FRU) defined by a type and a current design version, comprising:
(a) building an ECO history for the FRU by storing all ECOs implemented to the FRU during any manufacturing and repair processes on a non-volatile storage on-board the FRU;
(b) receiving a new ECO specifying a change to the FRU;
(c) whenever the FRU includes a programmable element for implementing an application of a certain version, comparing the ECO history against the application version;
(d) effecting the change specified by a new ECO for the FRU; and
(e) updating the ECO history with the new ECO, and wherein when the new ECO is a non-mandatory ECO, the new ECO is only implemented in the manufacturing process for the new FRU.

5. A method of recording engineering change orders (ECOs) issued for a field replaceable unit (FRU) defined by a type and a current design version, comprising:
a) building an ECO history for the FRU by storing all ECOs implemented to the FRU during any manufacturing and repair processes on a non-volatile storage on-board the FRU, the ECO history identifies a manufacturing process and a corresponding manufacturing implementation action, storing in the ECO history of any new FRU that is manufactured according to the new design version, the new ECO that resulted in the new design version;
b) receiving a new ECO specifying a change to the FRU, the ECO history identifies a manufacturing process and a corresponding manufacturing implementation action, returning the FRU for implementing the change;
identifying and effecting the manufacturing process on the FRU according to the manufacturing implementation action; and
changing the current design version of the FRU with a new design version,
c) whenever the FRU includes a programmable element for implementing an application of a certain version, comparing the ECO history against the application version;
d) effecting the change specified by a new ECO for the FRU;
d.i) returning the FRU for implementing the change;
d.j) checking the version of the FRU upon its return for implementing the change;
d.k) comparing the history of the FRU stored on the non-volatile storage with the list of ECO's for identifying any mandatory change that was not implemented on the FRU;
d.l) updating the FRU according to any mandatory change identified in step d.k) and with the change specified by the new ECO;
d.m) changing the current design version with a new design version if a mandatory change has been implemented at step d.k).
e) updating the ECO history with the new ECO.

* * * * *

UNITED STATES PATENT AND TRADEMARK OFFICE
CERTIFICATE OF CORRECTION

PATENT NO. : 7,174,276 B2 Page 1 of 1
APPLICATION NO. : 11/215945
DATED : February 6, 2007
INVENTOR(S) : Swanson et al.

It is certified that error appears in the above-identified patent and that said Letters Patent is hereby corrected as shown below:

TITLE PAGE, ITEM (12) the first inventor's last name is corrected to read:
-- Swanson et al --.

TITLE PAGE, ITEM (75) is corrected to read:
-- Inventors: Sheldon Keith John Swanson, Ottawa (CA);
Kenneth Glenn MacQueen, Merrickville (CA) --

Signed and Sealed this

Twenty-ninth Day of May, 2007

JON W. DUDAS
*Director of the United States Patent and Trademark Office*